(12) United States Patent
Gao (10) Patent No.: US 11,963,331 B2
(45) Date of Patent: Apr. 16, 2024

(54) FULLY REDUNDANT COOLING UNIT WITH PHASE CHANGE FLOW CONTROL UNIT

(71) Applicant: BAIDU USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 186 days.

(21) Appl. No.: 17/360,058

(22) Filed: Jun. 28, 2021

(65) Prior Publication Data

US 2022/0418149 A1  Dec. 29, 2022

(51) Int. Cl.
  *H05K 7/20* (2006.01)

(52) U.S. Cl.
  CPC ......... *H05K 7/203* (2013.01); *H05K 7/20327* (2013.01); *H05K 7/208* (2013.01); *H05K 7/20381* (2013.01); *H05K 7/20836* (2013.01)

(58) Field of Classification Search
  CPC ........... H05K 7/20836; H05K 7/20281; H05K 7/203; H05K 7/208; H05K 7/20318; H05K 7/20327; H05K 7/20627; H05K 7/20663; H05K 7/207; H05K 7/20727; H05K 7/20763; H05K 7/20272; G06F 2200/201; G06F 1/20; G06F 1/206; G05B 19/042
  See application file for complete search history.

(56) References Cited

U.S. PATENT DOCUMENTS

| | | | | |
|---|---|---|---|---|
| 5,343,935 A * | 9/1994 | Sumitani | ................. | F24F 3/065 |
| | | | | 62/238.7 |
| 6,606,871 B2 * | 8/2003 | Butcher | .................... | F24F 11/88 |
| | | | | 62/298 |
| 7,088,585 B2 * | 8/2006 | Chu | ..................... | H05K 7/2079 |
| | | | | 361/699 |
| 7,106,590 B2 * | 9/2006 | Chu | ..................... | H05K 7/2079 |
| | | | | 165/80.4 |
| 8,606,414 B2 * | 12/2013 | Ludwig | ................ | G05D 7/0694 |
| | | | | 700/282 |
| 9,010,141 B2 * | 4/2015 | Harrington | ......... | F28D 15/0233 |
| | | | | 62/169 |
| 9,750,165 B2 * | 8/2017 | Chainer | ................... | F28F 27/02 |
| 10,010,013 B2 * | 6/2018 | Shelnutt | ............. | H05K 7/20781 |
| 10,225,958 B1 * | 3/2019 | Gao | .................... | H05K 7/20781 |
| 10,238,010 B2 * | 3/2019 | Shelnutt | .................. | G06F 1/206 |
| 10,917,998 B2 * | 2/2021 | Shelnutt | ............. | H05K 7/20772 |

(Continued)

*Primary Examiner* — Darrin D Dunn
(74) *Attorney, Agent, or Firm* — WOMBLE BOND DICKINSON (US) LLP (57) ABSTRACT

In one embodiment, a liquid cooling apparatus includes a first cooling loop to provide cooling liquid to a heat load, wherein the first cooling loop comprises a first condenser unit, a first liquid supply line, and a first vapor return line and a second cooling loop to provide cooling liquid to the heat load, wherein the second cooling loop comprises a second condenser unit, a second liquid supply line, and a second vapor return line, wherein the first vapor return line and the second vapor return line are coupled by an interconnection loop. The liquid cooling apparatus further includes a first pressure sensor coupled to the first vapor return line, a second pressure sensor coupled to the second vapor return line, and at least one main cooling source controlled based on the first pressure sensor and the second pressure sensor.

18 Claims, 5 Drawing Sheets

(56) References Cited

U.S. PATENT DOCUMENTS

| | | | | |
|---|---|---|---|---|
| 10,966,349 | B1* | 3/2021 | Lau | H05K 7/20281 |
| 2005/0122685 | A1* | 6/2005 | Chu | H05K 7/2079 |
| | | | | 361/689 |
| 2012/0022705 | A1* | 1/2012 | Ludwig | G05D 7/0694 |
| | | | | 700/282 |
| 2013/0085618 | A1* | 4/2013 | Ding | G05D 7/0664 |
| | | | | 700/282 |
| 2015/0060009 | A1* | 3/2015 | Shelnutt | H05K 7/203 |
| | | | | 165/11.1 |
| 2017/0057794 | A1* | 3/2017 | O'Brien | E02F 3/963 |
| 2019/0320548 | A1* | 10/2019 | Gao | H05K 7/1488 |
| 2020/0146188 | A1* | 5/2020 | Shelnutt | H05K 7/20781 |
| 2020/0275579 | A1* | 8/2020 | Gao | H05K 7/1487 |
| 2021/0153392 | A1* | 5/2021 | Gao | H05K 7/20818 |
| 2022/0305403 | A1* | 9/2022 | McGhee | B01D 11/0288 |
| 2022/0338387 | A1* | 10/2022 | Enright | H05K 7/20809 |
| 2022/0361378 | A1* | 11/2022 | Alissa | H05K 7/208 |
| 2022/0369519 | A1* | 11/2022 | Heydari | H05K 7/20827 |

\* cited by examiner

```
┌─────────────────────────────────────────────┐
│ MEASURE VAPOR PRESSURE IN A FIRST VAPOR RETURN │──510
│ LOOP VIA A FIRST PRESSURE SENSOR AND VAPOR   │
│ PRESSURE IN A SECOND VAPOR RETURN LOOP VIA A │
│ SECOND PRESSURE SENSOR                       │
└─────────────────────────────────────────────┘
                      │
                      ▼
┌─────────────────────────────────────────────┐
│ DETERMINE A HEAT LOAD EXTRACTED FROM THE FIRST │──520
│ VAPOR RETURN LOOP AND THE SECOND VAPOR RETURN │
│ LOOP BASED ON THE VAPOR PRESSURE MEASURED BY THE │
│ FIRST PRESSURE SENSOR AND THE SECOND PRESSURE │
│ SENSOR                                       │
└─────────────────────────────────────────────┘
                      │
                      ▼
┌─────────────────────────────────────────────┐
│ CONTROL THE COOLING CAPACITY TO A FIRST CONDENSER │──530
│ UNIT BASED ON THE VAPOR PRESSURE AND THE HEAT LOAD │
│ OF THE FIRST VAPOR RETURN LOOP               │
└─────────────────────────────────────────────┘
                      │
                      ▼
┌─────────────────────────────────────────────┐
│ CONTROL THE COOLING CAPACITY TO A SECOND     │──540
│ CONDENSER UNIT BASED ON THE VAPOR PRESSURE AND │
│ THE HEAT LOAD OF THE SECOND VAPOR RETURN LOOP │
└─────────────────────────────────────────────┘
                      │
                      ▼
┌─────────────────────────────────────────────┐
│ IDENTIFY ABNORMAL OPERATION OF THE FIRST OR SECOND │──550
│ COOLING LOOP BASED ON THE VAPOR PRESSURE     │
│ MEASURED BY THE FIRST AND SECOND PRESSURE    │
│ SENSORS                                      │
└─────────────────────────────────────────────┘
```

FIG. 5

FULLY REDUNDANT COOLING UNIT WITH PHASE CHANGE FLOW CONTROL UNIT

FIELD OF THE DISCLOSURE

Embodiments of the present invention relate generally to data centers. More particularly, embodiments of the invention relate to a fully redundant phase change cooling unit with a flow control unit.

BACKGROUND

Thermal management of a data center that includes several active electronic racks is critical to ensure proper performance of servers and other IT equipment operating in the racks. Without proper thermal management the thermal environment within the racks may exceed operational thresholds, resulting in operational consequences (e.g., servers failing, etc.). One way to manage the thermal environment is the use of cooling air to cool the IT equipment. A majority of existing data centers are air cooled. Recently, data centers have been deploying more high-power density electronic racks, where more high density chips are packaged closer together to provide more processing power. Cooling these high-density racks by maintaining a proper thermal environment may be a challenge with existing cooling systems, especially within the constant increasing power density of the racks.

Existing solutions for cooling systems include phase changes systems. Such systems, however, may not include redundant design or may not provide full redundancy of the overall cooling system, which means a single failure port is included. Additionally, the existing solutions may require significant amount of tuning and control even after the solution has been deployed.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure provide an advanced phase change cooling system with full redundancy. The phase change cooling system may include two condenser units operating in a parallel manner. Each of the condenser units may be coupled to a liquid supply line to provide cooling liquid to electronics and a vapor return line to return gas phase evaporated coolant to the condenser unit from the electronics. In some examples, the two vapor lines may be connected through a dedicated connection line. Thus, the vapor in the vapor return lines may travel to the adjacent condensing unit. In one example, a pressure sensor may be coupled to each vapor return line after the discharge side of the connection loop (e.g., between the condenser unit and the connection loop). In another example, two-way pressure reducer may be included on the connection line and the pressure sensors may be coupled to the connection line on either side of the two-way reducer. In some embodiments, a single main cooling supply may be provided to both condenser units, while in other embodiments, a double (e.g., parallel) source may be provided to the condenser units. The fluid provided by the cooling supply may be controlled through fluid pumps on the single or double main cooling supply. The pressure sensors on the vapor return lines may measure the vapor pressure in the vapor return lines and control (e.g., via a microcontroller) the fluid pumps accordingly.

Embodiments of the present disclosure may thus enable advanced thermal management for data centers and servers. Embodiments may accommodate different system levels and cluster level architectures. Additional advantages of the present disclosure include high system reliability, increased power efficiency, and compatibility with different systems and facility infrastructure.

According to one embodiment, liquid cooling apparatus, includes a first cooling loop to provide cooling liquid to a heat load, wherein the first cooling loop comprises a first condenser unit, a first liquid supply line, and a first vapor return line and a second cooling loop to provide cooling liquid to the heat load, wherein the second cooling loop comprises a second condenser unit, a second liquid supply line, and a second vapor return line, wherein the first vapor return line and the second vapor return line are coupled by an interconnection loop. The liquid cooling apparatus further includes a first pressure sensor coupled to the first vapor return line, a second pressure sensor coupled to the second vapor return line, and at least one main cooling source controlled based on the first pressure sensor and the second pressure sensor.

In one embodiment, the at least one main cooling source includes a first main cooling source controlled by a first fluid control valve associated with the first condenser unit and a second main cooling source controlled by a second fluid control valve associated with the second condenser unit. In one embodiment, the at least one main cooling source comprises a first main cooling source controlled by a first fluid pump and a second main cooling source controlled by second fluid pump. In one embodiment, a two-way fluid control valve couples the first main cooling source and the second main cooling source.

In one embodiment, the liquid cooling apparatus further includes a two-way fluid reducer disposed on the interconnection loop. In one embodiment, the first pressure sensor and the second pressure sensor are disposed on the interconnection loop and the two-way fluid reducer is disposed between the first pressure sensor and the second pressure sensor on the interconnection loop. In one embodiment, the heat load comprises one or more electronics in an immersion cooling system. In one embodiment, the heat load comprises one or more servers of an electronics rack coupled with one or more cooling devices of the first or second cooling loop. In one embodiment, the liquid cooling apparatus further includes a microcontroller to receive pressure data from the first pressure sensor and the second pressure sensor and to control the at least one main cooling source based on the pressure data. In some embodiments, the two-way reducer and the first and second pressure sensors are used to characterize and capture the heat load between the two condensers under several scenarios. The heat load between the condensers can be captured and characterized, and then be used to control the delivery of cooling capacity to the condensers and the distribution of coolant to the condensers via the at least one main cooling sources by adjusting the fluid pumps and/or fluid valves associated with the at least one main cooling source.

Figure 1:
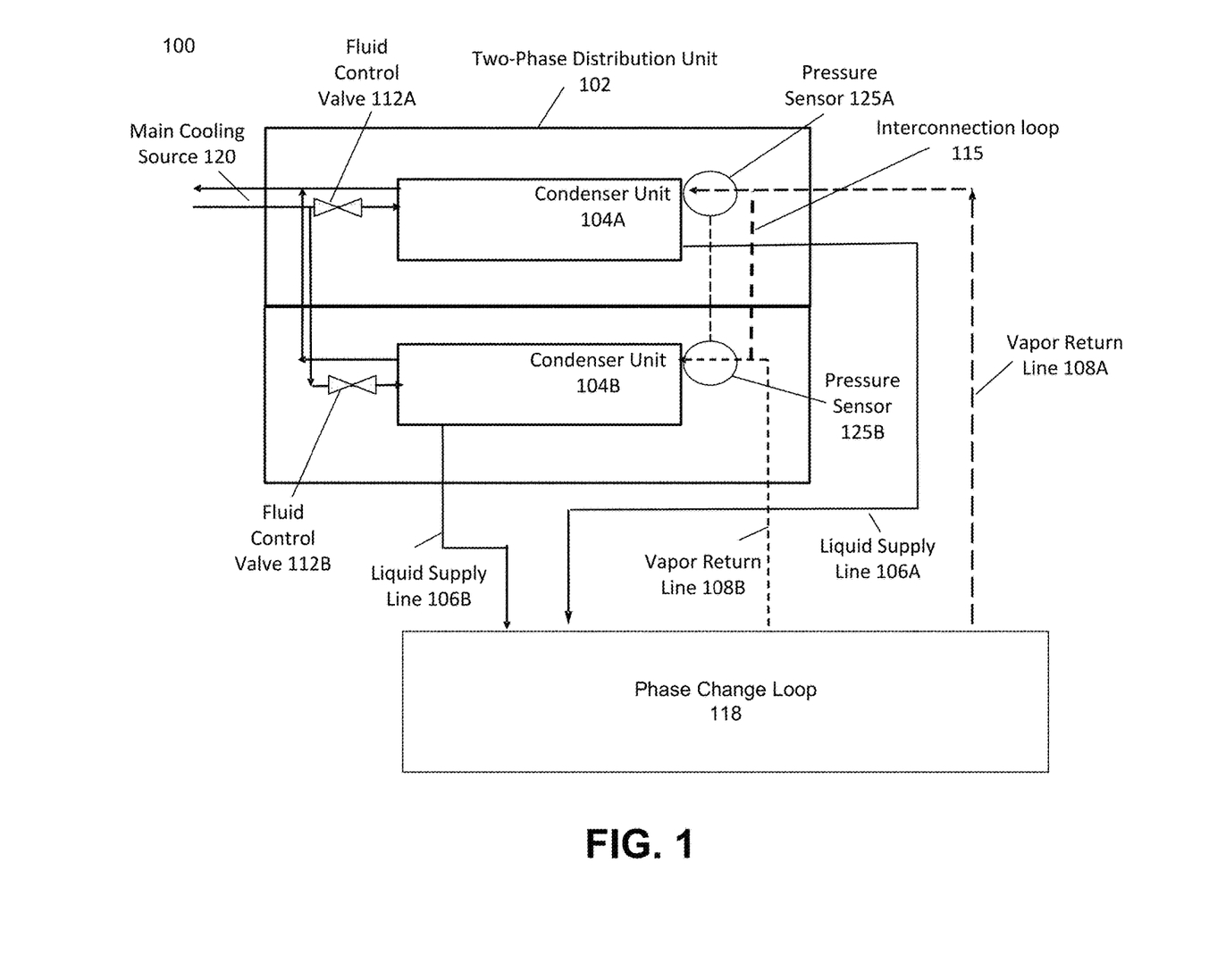
FIG. 1 is a system diagram of a two-phase cooling system design, according to one embodiment.

FIG. 1 shows a two-phase cooling system design 100, according to one embodiment. The two-phase cooling system design 100 may include two redundant cooling loops. The two-phase distribution unit may include two loops each of which includes a main cooling source, a condenser unit, phase change loops, and a pressure sensor. The load may be a two-phase based immersion cooling system, a thermosiphon based cooling system, or any other cooling system load.

Pressure sensors may be included within the distribution unit and may be used for sensing the pressure of the vapor in the vapor return loops. The pressure sensors may be located on the discharge side of the connection loop to measure the vapor pressure. The pressure sensors can be used to control the individual valves of the main cooling source. In one example, the two-phase cooling system design 100 may include a single main cooling source and two individual valves for independently controlling the capacity to the condenser units.

In one embodiment, referring to FIG. 1, the cooling system 100 includes a two phase distribution unit 102. In one example, the two phase distribution unit 102 includes two condenser units 104A-B, each coupled to a liquid supply and vapor return loop for providing liquid cooling to electronics. For example, condenser unit 104A may be coupled to liquid supply line 106A to provide cooling liquid to a phase change loop coupled to a heat load (e.g., immersion system, or other phase-change system of an electronics rack). Condenser unit 104A may further be coupled to vapor return line 108A for returning vapor (e.g., evaporated cooling liquid) from the phase change loop to condenser unit 104A. Similarly, condenser unit 104B may be coupled to a liquid supply line 106B and a vapor return line 108B each with similar functionality to liquid supply line 106A and vapor return line 108A, respectively. As depicted, condenser unit 104A and 104B may both receive a cooling liquid from a main cooling source 120 (e.g., via a primary cooling loop) that the condenser units 104A-B may use to cool and condense the vapor returned via vapor return 108A and 108B.

According to some embodiments, a first pressure sensor 125A may be coupled to the vapor return line 108A and a second pressure sensor 125B may be coupled to the vapor return line 108B. In one example, the first pressure sensor 125A continuously or periodically measures the vapor pressure in the vapor return line 108A. Similarly, the second pressure sensor 125B continuously or periodically measures the vapor pressure in vapor return line 108B.

In one example, vapor return line 108A and 108B may be connected via interconnection loop 115. Interconnection loop 115 allows vapor to travel between vapor return line 108A and 108B. Thus, if both condenser units 104A-B are operating at the same time then the heat load may be nearly evenly distributed between the two condenser units 104A-B. Alternatively, if one of the condenser units 104A or 104B are not operational (e.g., have failed) then the vapor may travel between the vapor return lines 108A-B so that the operational condenser unit 104A or 104B may handle the entire heat load. Additionally, in such an embodiment, the pressures measured by the sensor pressures 125A-B may be the same or similar because the vapor is allowed to freely travel between vapor return lines 108A-B. In one example, the pressure measured by pressure sensor 125B may control the fluid control valve 112A, and thus the cooling capacity of condenser unit 104A. Similarly, the pressure measure by pressure sensor 125A may control the fluid control valve 112B, and thus the cooling capacity of condenser unit 104B. In one example, a heat load (e.g., electronics) may be included in phase change loop 118, which may be cooling plates of an electronics rack, an immersion cooling system, or other phase change cooling loop. The phase change loop 118 can be understood as the cooling loop within an information technology (IT) system, since the fluid changes phase within the cooling loop inside the IT system, it can be understood as a phase change line or a phase change loop.

Figure 2:
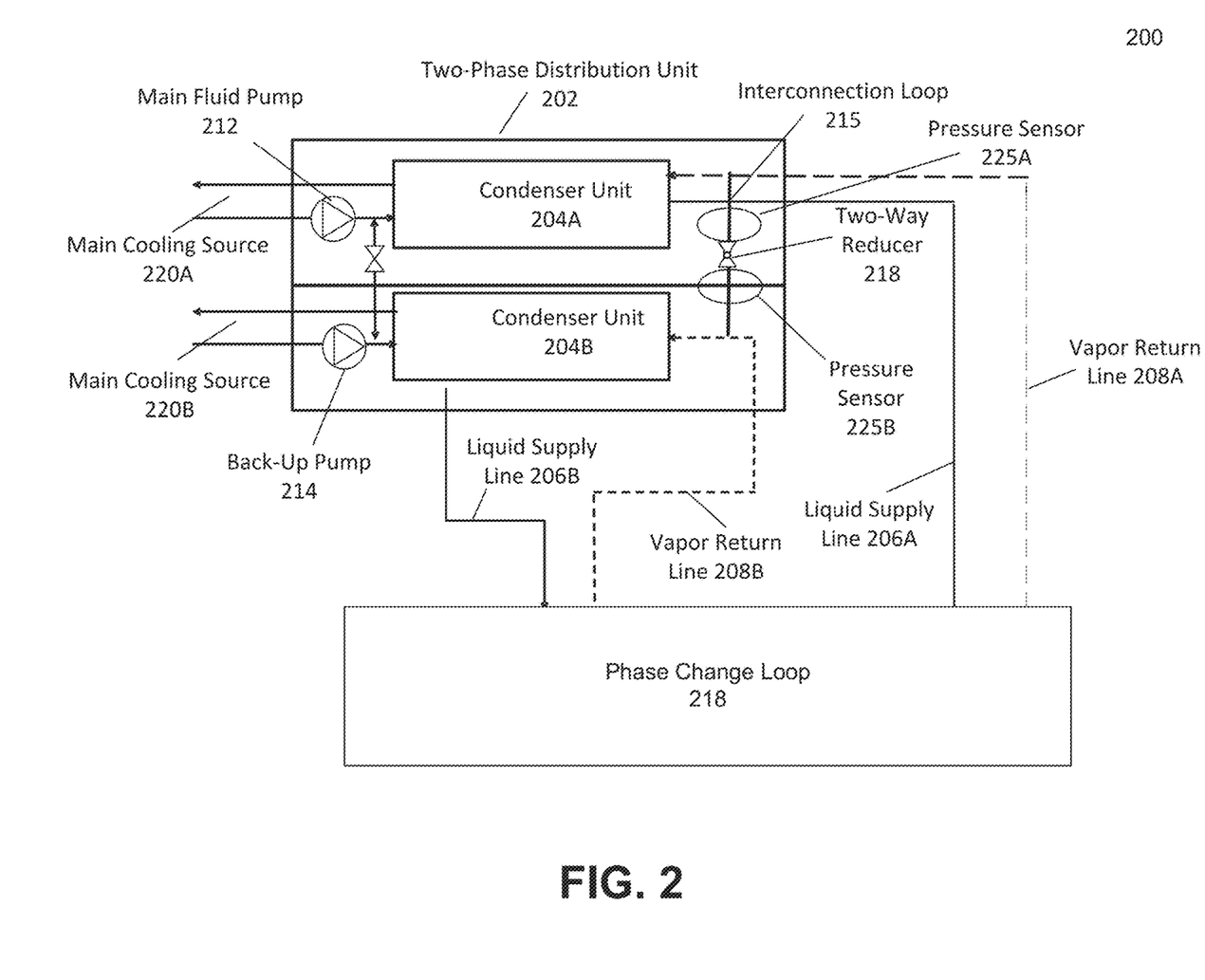
FIG. 2 is a system diagram of a two-phase cooling system design, according to one embodiment.

FIG. 2 shows a cooling system design 200 according to some embodiments. An interconnection loop may connect vapor return lines of parallel cooling loops. Pressure sensors may be disposed on the interconnection loop. Additionally, a two-way fluid reducer may be included on the interconnection loop between the pressure sensors.

In one embodiment, referring to FIG. 2, the cooling system 200 may include a two-phase distribution unit 202, which may be the same or similar to two-phase distribution unit 102. The two-phase distribution unit 202 may include two condenser units 204A-B, which may be the same or similar to condenser units 104A-B. Similar to system 100 of FIG. 1, cooling system 200 includes a liquid supply 206A-B and a vapor return 208A-B for each condenser to provide cooling liquid to and receive vapor from a heat load, such as a server or cluster of servers. The heat load may be included in phase change loop 218, which may be an electronics rack, an immersion cooling system, or other phase change cooling loop. In one example, an interconnection loop 215 may connect vapor return line 308A and 308B. Pressure sensors 225A-B can be coupled to the interconnection loop 215 on each side of a two-way reducer 218. The two-way reducer 218 can generate a pressure differential between the vapor return lines 208A-B, in either direction. Therefore, the pressures measured by pressure sensor 225A may be different than the pressures measured by the pressure sensor 225B. The differences in measured pressure may indicate the flow of vapor through the two-way reducer, as well as indicates the difference of the vapor load between the two lines. Thus, the measured vapor pressures and the vapor flow may provide accurate heat load conditions that can be used to adjust the cooling main cooling sources 220A-B and the cooling capacity of condenser units 204A-B.

Similar to FIG. 1, pressure sensors 225A-B may be used to control a main cooling source 220A to condensers 204A and main cooling source 220B to condenser 204B via fluid control valve main fluid pumps 212 and 214. The pressure sensors 225A-B may operate as redundant units for pressure measurement. In one example, a two-way valve may couple the inputs of the main cooling sources 220A-B such that the main fluid pump 212 or the back-up pump 214 may provide a cooling fluid to either of the condenser units 204A-B depending on the operational state of each of the condenser units 204A-B, the main cooling sources, 220A-B, etc. Additionally, the pressure measurements of the pressure sensors 225A-B may provide information on the operational state of the condenser units 204A-B, and the heat load being returned by each vapor return line 208A-B. The two-way valve and the main fluid pump 212 and back-up pump 214 may then be controlled depending on the particular scenario. For example, if main fluid pump 212 fails, the back-up pump 214 may provide cooling fluid to condenser unit 204A via the two-way valve. In another example, if the pressure sensors 225A-B indicate failure of either of the condenser units 204A-B, then the main fluid pump 212 and the back-up pump 214, as well as the two-way valve, may be controlled to provide cooling liquid, and thus cooling capacity being delivered to the operational condenser unit 204A or 204B.

Figure 3:
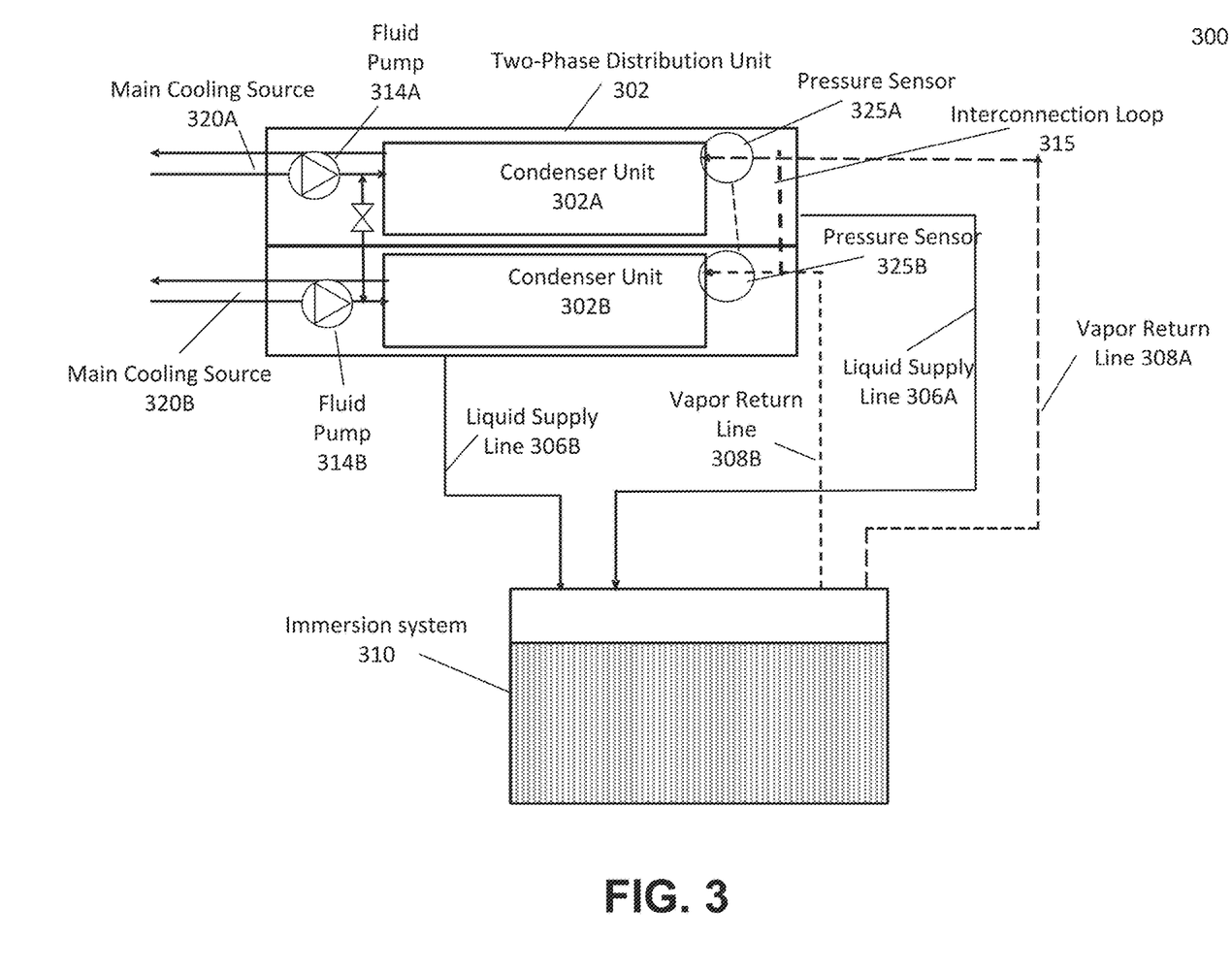
FIG. 3 is a system diagram of a two-phase cooling system design, according to one embodiment.

FIG. 3 shows another redundant two-phase cooling design in which the two-phase distribution unit includes a parallel main cooling source input with fluid pumps. The cooling design may be used in conjunction with an immersion system, meaning that the vapor generated within the immersion system or cluster may be changed largely and distributed differently to the two vapor return lines. The present embodiment may provide for efficient management of the parallel cooling systems depending on the heat load provided to each condenser unit of the cooling system.

In one embodiment, referring to FIG. 3, a cooling system 300 may include a two-phase distribution unit 302, which may be similar to two-phase distribution unit 102 and 202. Similar to system 100 of FIG. 1, system 300 includes two condenser units 304A-B and a liquid supply 306A-B and a vapor return 308A-B for each condenser unit 304A-B to provide cooling liquid to and receive vapor from an immersion system 310. The immersion system 310 can be a tank filled with a cooling liquid (e.g., filled via the liquid supply lines 306A-B) in which one or more servers or other electronic devices are immersed for cooling. The heat generated during operation of the servers may be extracted by evaporation of the cooling liquid. The evaporated cooling liquid, otherwise referred to as vapor, may then travel back to the condenser units 304A-B via vapor return lines 308A-B.

In some embodiments, system 300 further includes a fluid control valve 312A-B associated with each condenser unit 304A-B. System 300 may further include a pressure sensor 325A on vapor return line 308A and a pressure sensor on vapor return line 308B. As depicted, pressure sensor 325A may communicate with and control fluid control valve 312A while pressure sensor 325B may communicate with and control fluid control valve 312B.

Similar to FIG. 2, pressure sensors 325A-B may be used to control a main cooling source 320A to condensers 304A and main cooling source 320B to condenser 304B via fluid control valve main fluid pumps 314A and 314B. The pressure sensors 325A-B may operate as redundant units for pressure measurement.

Figure 4:
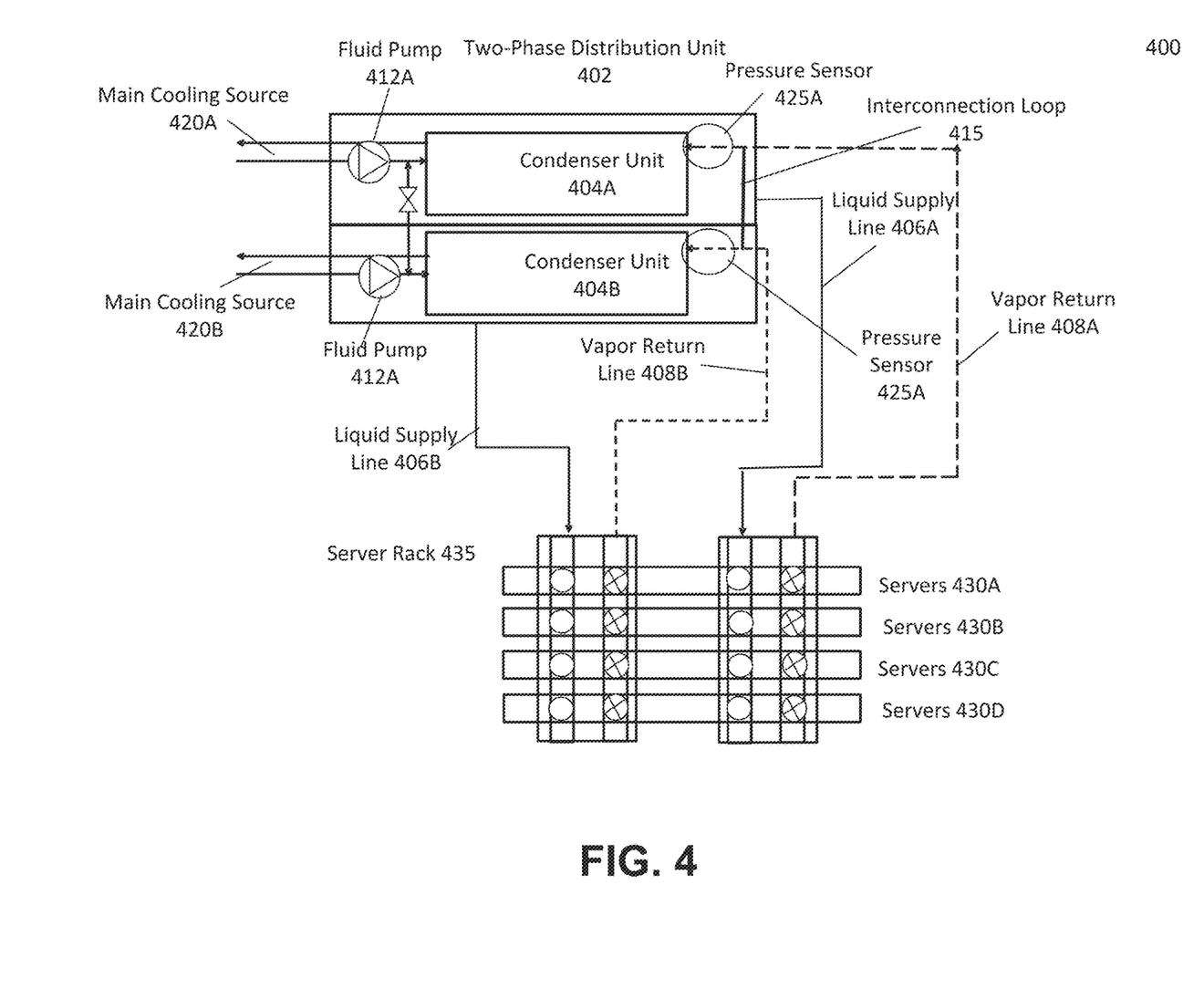
FIG. 4 is a system diagram of a two-phase cooling system design, according to one embodiment.

FIG. 4 shows another redundant two-phase cooling design in which the two-phase distribution unit includes a parallel main cooling source input with fluid pumps. The cooling design may be used in conjunction with an immersion system, meaning that the vapor generated within the immersion system or cluster may be changed largely and distributed differently to the two vapor return lines. The present embodiment may provide for efficient management of the parallel cooling systems depending on the heat load provided to each condenser unit of the cooling system.

In one embodiment, referring to FIG. 4, a cooling system 400 may include a two-phase distribution unit 402, which may be similar to two-phase distribution unit 102, 202, and 302. Similar to system 300 of FIG. 3, system 400 includes two condenser units 404A-B, a liquid supply line 406A-B and a vapor return line 408A-B for each condenser unit 404A-B to provide cooling liquid to and receive vapor from a server rack 435 of several servers 430A-D and a main cooling source 420A-B with a fluid pump 412A-B to provide cooling fluid to condenser units 404A-B. System 400 may further include a pressure sensor 425A on vapor return line 408A and a pressure sensor on vapor return line 408B. As depicted, pressure sensors 425A-B may be packaged within the two-phase distribution unit 402. Additionally, an interconnection loop 415 may couple the vapor return lines 408A-B. A two-way fluid valve may also be disposed between the main cooling sources 420A-B which may be used to direct the cooling fluid from one main cooling source (e.g., 420A) to the opposite condenser unit (e.g., condenser unit 404B).

Figure 5:
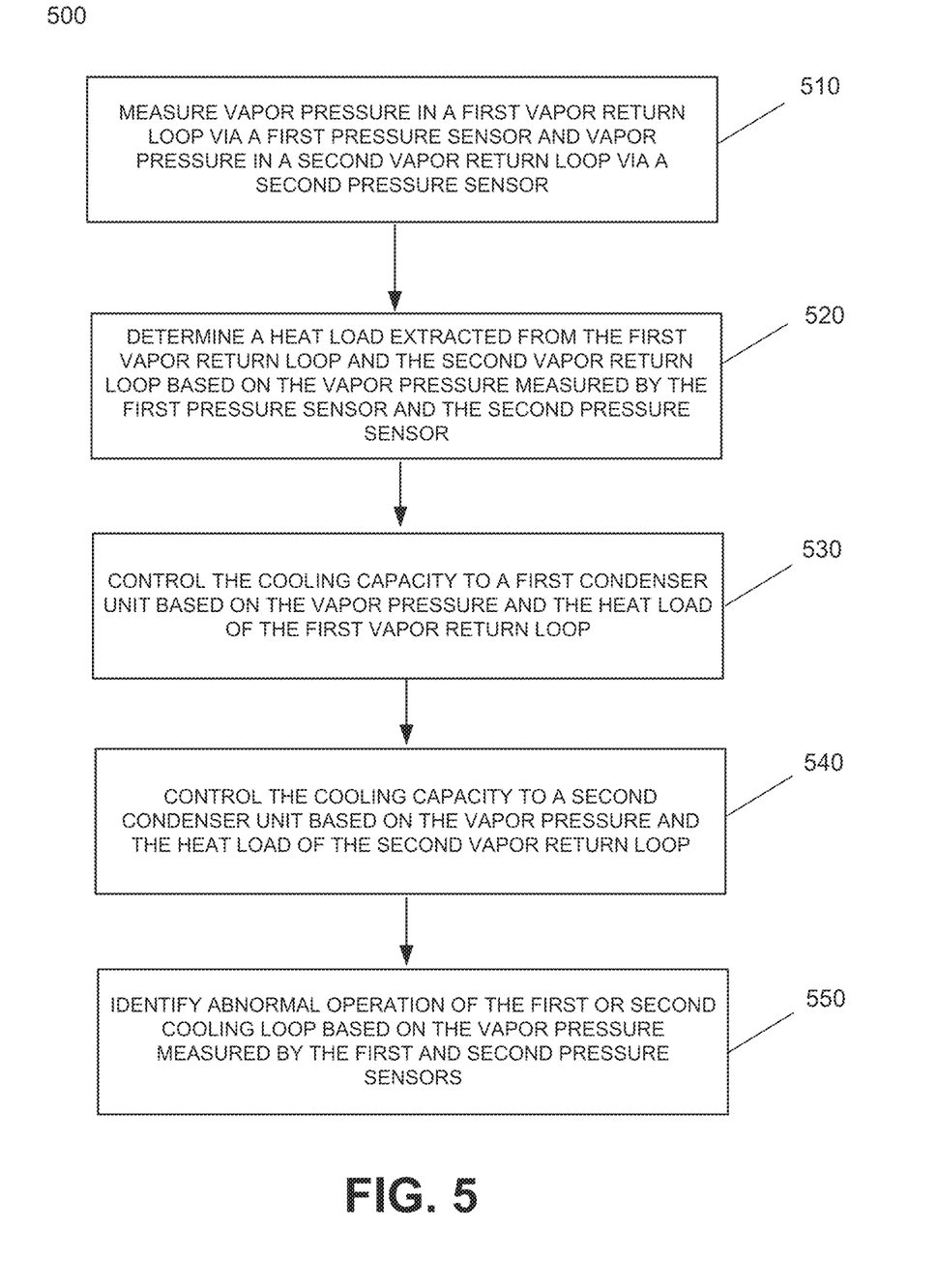
FIG. 5 is a flow diagram of a method of operating a two-phase cooling system, according to one embodiment.

FIG. 5 illustrates a flow diagram of a method 500 of operating parallel cooling loops based on vapor return line pressure. At block 510, vapor pressure in a first vapor return loop is measured via a first pressure sensor and vapor pressure in a second vapor return loop is measured via a second pressure sensor. At block 520, a heat load extracted from the first vapor return loop and the second vapor return loop is determined based on the vapor pressure measured by the first pressure sensor and the second pressure sensor. At block 530, processing logic (e.g., a microcontroller) controls the cooling capacity to a first condenser unit based on the vapor pressure and the heat load of the first vapor return loop. At block 540, processing logic controls the cooling capacity to a second condenser unit based on the vapor pressure and the heat load of the second vapor return loop. Block 540 and block 530 may be performed concurrently and in parallel to dynamically control the cooling capacity of the two condenser units based on the pressure data measures by the first and second pressure sensor. Optionally, at block 540, processing logic may identify abnormal operation of the first or second cooling loop based on the vapor pressure measured by the first and second pressure sensors.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling apparatus, comprising:
   a first cooling loop to provide cooling liquid to a heat load, wherein the first cooling loop comprises a first condenser unit, a first liquid supply line, and a first vapor return line;
   a second cooling loop to provide cooling liquid to the heat load, wherein the second cooling loop comprises a second condenser unit, a second liquid supply line, and a second vapor return line;

an interconnection loop coupled to the first vapor return line and the second vapor return line;

a two-way fluid reducer disposed on the interconnection loop coupling the first vapor return line with the second vapor return line;

a first pressure sensor coupled to the first vapor return line;

a second pressure sensor coupled to the second vapor return line; and at least one main cooling source controlled based on the first pressure sensor and the second pressure sensor.

2. The cooling apparatus of claim 1, wherein the at least one main cooling source comprises a first main cooling source controlled by a first fluid control valve associated with the first condenser unit and a second main cooling source controlled by a second fluid control valve associated with the second condenser unit.

3. The cooling apparatus of claim 1, wherein the at least one main cooling source comprises a first main cooling source controlled by a first fluid pump and a second main cooling source controlled by second fluid pump.

4. The cooling apparatus of claim 3, wherein a two-way fluid control valve couples the first main cooling source and the second main cooling source.

5. The cooling apparatus of claim 1, wherein the first pressure sensor and the second pressure sensor are disposed on the interconnection loop and the two-way fluid reducer is disposed between the first pressure sensor and the second pressure sensor on the interconnection loop.

6. The cooling apparatus of claim 1, wherein the heat load comprises one or more electronics in an immersion cooling system.

7. The cooling apparatus of claim 1, wherein the heat load comprises one or more servers of an electronics rack coupled with one or more cooling devices of the first or second cooling loop.

8. The cooling apparatus of claim 1, further comprising a microcontroller to receive pressure data from the first pressure sensor and the second pressure sensor and to control the at least one main cooling source based on the pressure data.

9. A cooling system, comprising:
a first cooling loop to provide cooling liquid to an immersion tank comprising a heat load, wherein the first cooling loop comprises a first condenser unit, a first liquid supply line, and a first vapor return line;

a second cooling loop to provide cooling liquid to the immersion tank, wherein the second cooling loop comprises a second condenser unit, a second liquid supply line, and a second vapor return line;

an interconnection loop coupled to the first vapor return line and the second vapor return line;

a two-way fluid reducer disposed on the interconnection loop coupling the first vapor return line with the second vapor return line;

a first pressure sensor coupled to the first vapor return line;

a second pressure sensor coupled to the second vapor return line; and at least one main cooling source comprising a fluid control valve controlled based on the first pressure sensor and the second pressure sensor.

10. The cooling system of claim 9, wherein the at least one main cooling source comprises a first main cooling source controlled by a first fluid control valve associated with the first condenser unit and a second main cooling source controlled by a second fluid control valve associated with the second condenser unit.

11. The cooling system of claim 9, wherein the at least one main cooling source comprises a first main cooling source controlled by a first fluid pump and a second main cooling source controlled by second fluid pump.

12. The cooling system of claim 11, wherein a two-way fluid control valve couples the first main cooling source and the second main cooling source.

13. The cooling system of claim 9, wherein the first pressure sensor and the second pressure sensor are disposed on the interconnection loop and the two-way fluid reducer is disposed between the first pressure sensor and the second pressure sensor on the interconnection loop.

14. The cooling system of claim 9, wherein the heat load comprises one or more electronics in an immersion cooling system.

15. The cooling system of claim 9, wherein the heat load comprises one or more servers of an electronics rack coupled with one or more cooling devices of the first or second cooling loop.

16. A method of controlling a two-phase cooling distribution unit, comprising:
receiving pressure data from a first pressure sensor coupled to a first vapor return line of a first coolant distribution loop comprising a first condenser unit;

receiving pressure data from a second pressure sensor coupled to a second vapor return line of a second coolant distribution loop, wherein the second coolant distribution loop comprises a second condenser unit and operates in parallel with the first coolant distribution loop, and wherein an interconnection loop, comprising a two-way fluid reducer, is coupled to the first vapor return line and the second vapor return line;

controlling a cooling capacity of the first coolant distribution loop based on the pressure data from the second pressure sensor; and controlling a cooling capacity of the second coolant distribution loop based on the pressure data from the first pressure sensor.

17. The method of claim 16, further comprising:
determining a heat load extracted from the first vapor return line and the second vapor return line based on the pressure data measured by the first pressure sensor and the second pressure sensor.

18. The method of claim 16, further comprising:
identifying abnormal operation of the first or second coolant distribution loop based on the pressure data measured by the first and second pressure sensors.

* * * * *